(12) United States Patent
Le Gall et al.

(10) Patent No.: US 6,621,837 B2
(45) Date of Patent: Sep. 16, 2003

(54) WAVELENGTH STABILIZATION MONITOR AND METHOD FOR ADJUSTING THE WORKING WAVELENGTH OF SAID MONITOR

(75) Inventors: Franck Le Gall, Paris (FR); Daniel Mousseaux, St-Arnoult-en-Yvelines (FR)

(73) Assignee: Alcatel, Paris (FR)

(*) Notice: Subject to any disclaimer, the term of this patent is extended or adjusted under 35 U.S.C. 154(b) by 0 days.

(21) Appl. No.: 09/840,273

(22) Filed: Apr. 24, 2001

(65) Prior Publication Data

US 2002/0061039 A1 May 23, 2002

(30) Foreign Application Priority Data

Apr. 25, 2000 (EP) ............................................. 00440112

(51) Int. Cl.[7] ................................. H01S 3/13; H01S 3/00
(52) U.S. Cl. ........................................ 372/32; 372/38.01
(58) Field of Search ................................ 372/32, 29.02, 372/38.01, 36

(56) References Cited

U.S. PATENT DOCUMENTS

| 4,309,671 | A |   | 1/1982  | Malyon ........................ 372/31 |
| 4,583,228 | A |   | 4/1986  | Brown et al. .................. 372/32 |
| 4,998,256 | A |   | 3/1991  | Ohshima et al. ............... 372/32 |
| 5,825,792 | A | * | 10/1998 | Villeneuve et al. ........... 372/32 |

FOREIGN PATENT DOCUMENTS

| EP | 0 818 859 A1 | 1/1998 |
| GB | 2 268 323 A  | 1/1994 |

* cited by examiner

Primary Examiner—Quyen Leung
(74) Attorney, Agent, or Firm—Sughrue Mion, PLLC

(57) ABSTRACT

The invention is related to a wavelength stabilization monitor (1): with a laser source (7), two photodiodes (10, 11) in different light paths, and a wavelength filter (9), with a collimating element (8) and at least the collimating element (8) that can be moved in relation to the laser source (7).

8 Claims, 3 Drawing Sheets

(a)

(b)

(a)

(b)

WAVELENGTH STABILIZATION MONITOR AND METHOD FOR ADJUSTING THE WORKING WAVELENGTH OF SAID MONITOR

BACKGROUND OF THE INVENTION

The invention is based on a method of adjusting the wavelength of lasers and a wavelength stabilization monitor for regulating the wavelength of a laser, comprising an optical input, a splitter, a wavelength filter in one branch, and two photodetectors.

Methods of wavelength stabilization and adjusting are known from the prior art, for example from U.S. Pat. No. 4,583,228. A wavelength monitor is used in this wavelength stabilization method. Here the light of a laser firstly passes through a beam splitter and strikes a photodetector in each of two branches. One of the two branches contains a Fabry-Perot interferometer. The photocurrents supplied by the two photodiodes are compared in a differential amplifier and supply a resultant error signal required for the control circuit. The wavelength monitor is set at a defined wavelength or group of wavelengths. For this purpose, in one optical branch the Fabry-Perot filter is tuned and in the other optical branch the reference level is set by purposive attenuation of the signal. This known prior art is also described in detail in FIGS. 1 to 3. However, this is an elaborate method and corresponding monitor. Tunable Fabry-Perot filters are mechanically sensitive and cannot be integrated in a module with suitably small structural dimensions.

Also the angle of incidence of the optical beam is a sensible figure. It is know from the U.S. Pat. No. 4,998,256 to rotate the etalon in front of the optical beam for a better adjustment of the central wavelength of the wavelength monitor. This kind of adjustment within a low tolerance margins is difficult to achieve in an industrial environment. Again this kind of solution is a high cost solution which shows no evidence for a small low cost product.

SUMMARY OF THE INVENTION

The advantage of the wavelength monitor and the method according to the invention is that it is easily possible to adapt the monitor to different wavelengths by moving building blocks comprising several components relative to each other. Here a wavelength filter is used which is not tunable and thus has reduced sensitivity in respect of mechanical problems. The method allows an optimal adaptation for a wavelength in a mounting process with an additional step of fixing the building blocks relative to each other.

BRIEF DESCRIPTION OF THE DRAWINGS

Exemplary embodiments of the invention are illustrated in the drawing and explained in detail in the following description. In the drawing.

DETAILED DESCRIPTION OF THE INVENTION

Figure 1:
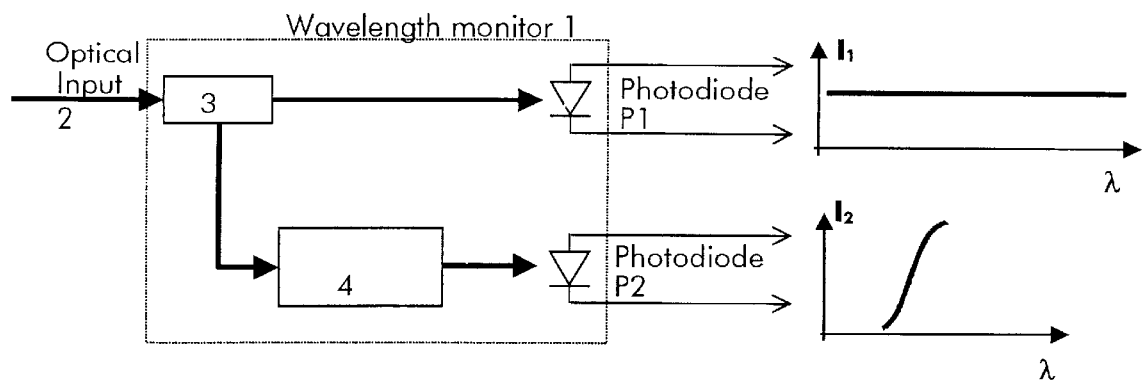
FIG. 1 illustrates a wavelength monitor according to the prior art.
Figure 2:
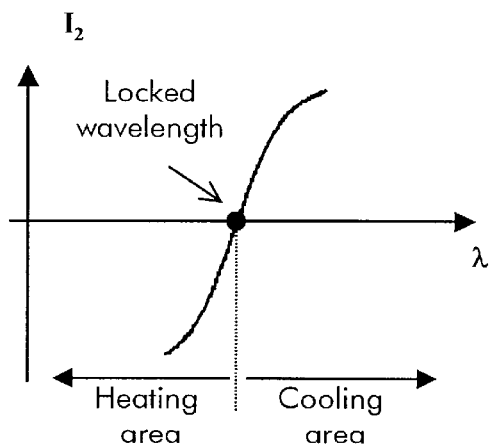
FIG. 2 illustrates the difference signal of a wavelength monitor.
Figure 3:
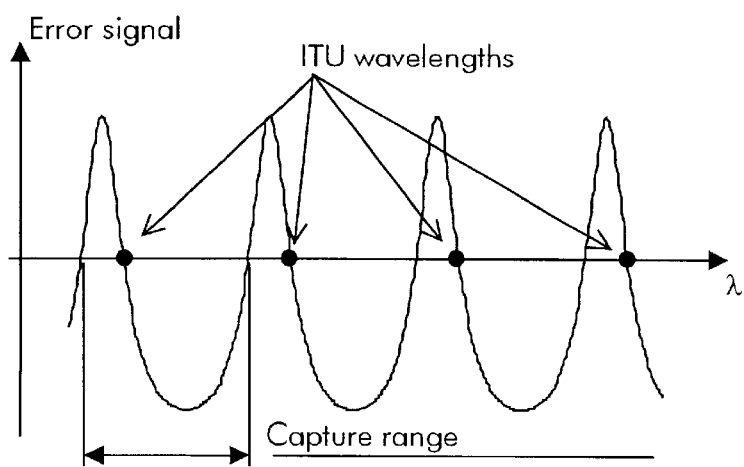
FIG. 3 illustrates the error signal of a monitor according to the prior art.

A wavelength stabilization monitor 1 is schematically illustrated in FIG. 1. A beam splitter 3 is connected to an optical input 2. The beam splitter 3 splits the light into two branches. The first output of the beam splitter 3 leads directly to a photodiode P1. The second optical output of the beam splitter 3 leads to the input of a wavelength filter 4, whose optical output leads to a photodiode P2. The photodiodes, the electrical connections of which have not been shown here, supply photocurrents. The photodiode P1 supplies a constant reference current $I_1$ relative to changes in the wavelength of the laser whose light is applied to the optical input 2. As a result of the wavelength filter, the photo diode P2 supplies a filter function $I_2$ in dependence upon the wavelength. The two photocurrents are analyzed in respect of their difference or ratio and supply a function illustrated in FIG. 2. The intersection point of these functions is set at the desired wavelength via the choice of filter and/or via the reference current. It is indicated in FIG. 2 that the wavelength of the laser can be adjusted by heating or cooling of the laser, whereby an intersection point not yet at the exact wavelength can be shifted. The reference current $I_1$ must supply a value such that the error signal becomes zero at the desired wavelength to be set. The error signal is then used to operate the laser temperature control stage. If the wavelength drifts towards small wavelengths, the control circuit compensates for this by heating the laser. If the wavelength drifts towards a larger wavelength, the control circuit cools the laser. When a wavelength monitor of this kind is used for wavelength division multiplex transmission systems, it is effective to select wavelength filters with a periodic characteristic. It is known to user Fabry-Perot filters here. In the simplest case one uses, for example, Air-Gap Fabry-Perot etalon as dispersive element. The use of a Fabry-Perot etalon allows to adjust the period of the interferometer so it corresponds to the wavelength pattern for the wavelength division multiplex. The error curve in the case of the use of such a periodic filter is illustrated in FIG. 3. Here the error signal of a periodic wavelength filter is plotted over the wavelength. It can be seen that, due to the periodic function, the value "zero" always occurs at the intersection point between reference signal and filter function, whereby the desired wavelengths can be set in the spacing of the free spectral region of the function. In this way it is possible to set a laser at different wavelengths. This reduces the number of different lasers to be used by an operator of a wavelength division multiplex transmission system. In accordance with the stipulations of the International Telecommunication Union (ITU), the accuracy with which the wavelengths are set here must amount to one tenth of the channel spacing between the wavelengths. Thus high accuracy levels are to be expected with channel spacings of 200 GHz. However, WDM systems with substantially smaller channel spacings are planned for the future, which will increase the demands on the wavelength monitors and control circuits. If one refers to the method of wavelength stabilization illustrated in FIG. 3, it will be seen that when the channel spacing between the individual wavelengths is reduced, it is necessary to adapt the period of the Fabry-Perot etalon.

Figure 4:
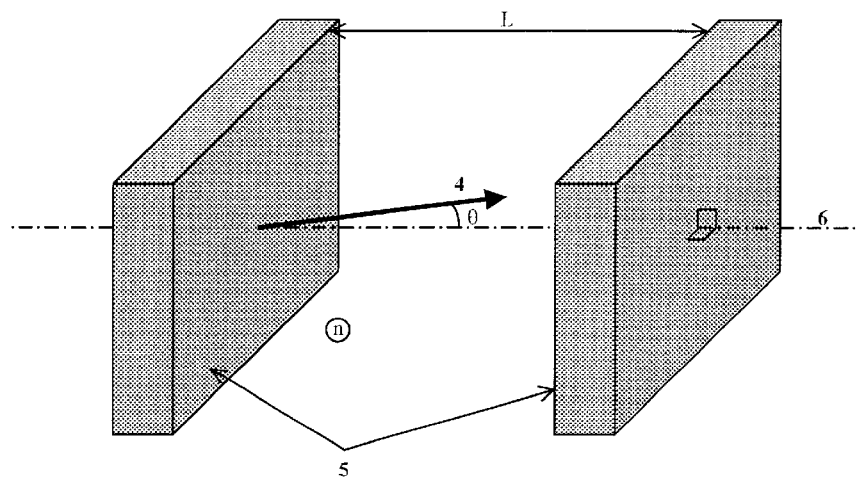
FIG. 4 illustrates a Fabry-Perot Etalon

FIG. 4 shows an etalon with two plates 5 and a air gap of length L between them. The optical axis 6 is perpendicular to the plates 5. To avoid back reflection into the lasers cavity the incident beam 4 has an angle θ between the perpendicular axis and the beam 4.

The angular dependence of the transmitted wavelength $\lambda_m$ at maximum transmission in a etalon described in FIG. 4 is given by:

$$\frac{d\lambda_m}{d\theta} = -\lambda_m \cdot \tan(\theta)$$

This means that at $\lambda_m$=1.55 μm and θ=2° the angular dependence of the wavelength is −1 nm/°.

To achieve the needed precision on the central wavelength, tolerances on the angular placement of the beam are very tight. For example, at $\lambda_m$1.55 μm and θ=2°, a±30 pm precision of the central wavelength needs a precision of the angle of incidence better than ±0.30°.

The easiest way to apply the inventional idea is to realize 2 building blocks. Each of them containing any number of the previously enumerated elements that are passively fixed to the building blocks (using brazing or gluing for example). The lens and the laser diode have to be on separated building blocks to allow the dynamic adjustment.

It should be noticed that the drawings only show displacements along the x-axis. The same effect could be obtained by displacements along the y-axis. The z-axis is used to adjust the collimation of the lens.

Figure 5:
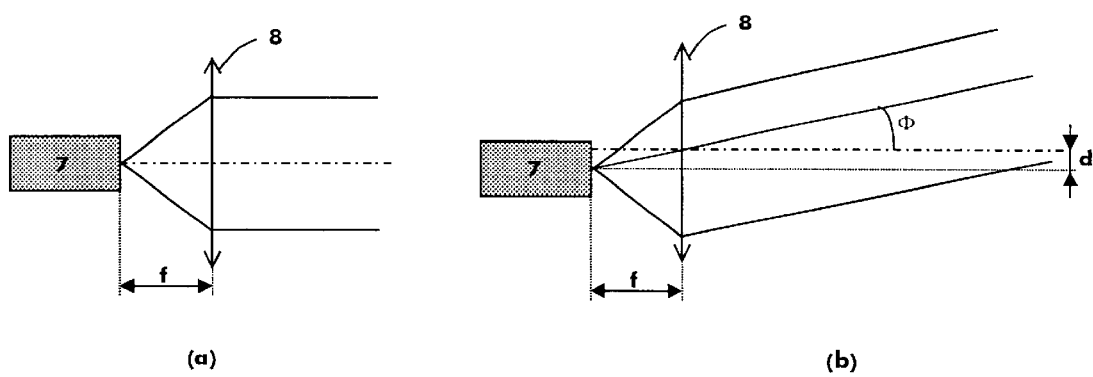
FIG. 5 illustrates a variation of the focal lens

One possibility to modify the angle of incidence of a beam is illustrated in FIG. 5. A collimating lens 8 is installed in the emission path of the laser diode 7. The distance between the focal point of the lens and the laser diode is the focal length f. The resulting beam is parallel for laser and lens are aligned. In FIG. 5b) the collimating lens 8 is shifted perpendicular to the optical axis by a distance d. This results in a angular deviation of φ.

Figure 6:
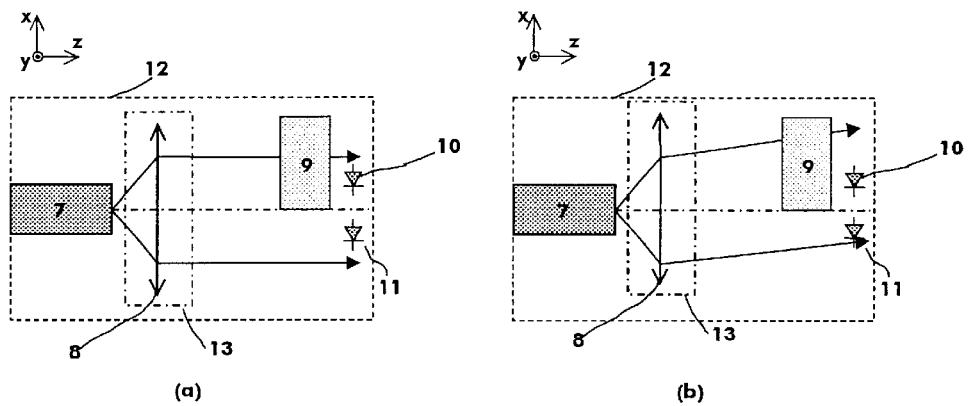
FIG. 6 schematically illustrates a first embodiment of a wavelength monitor according to the invention and FIG. 7 schematically illustrates a second embodiment of a wavelength monitor according to the invention.

FIG. 6 show a first embodiment of the invention. The wavelength monitor is mounted on two different building blocks 12 and 13. The building block 12 comprises the laser diode 7, the dispersive element 9 and the two photodiodes the wavelength monitoring photodiode 10 and the power monitoring photodiode 11. The building block 13 comprises the collimating lens 8.

In the drawings the beam separation is made by spatial splitting. Other means to do the separation (cube beamsplitter, separating plates. . . ) could be used as well. The type of dispersive element is not precised as well since it can be Fabry-Perot etalon or interferential filter. In fact, all wavelength filters could fit as long as they have sufficient spectral sensitivity to the angle of incidence of the input beam.

The FIG. 6b shows the variation made by moving the block 12 respectively to the block 13.

Figure 7:
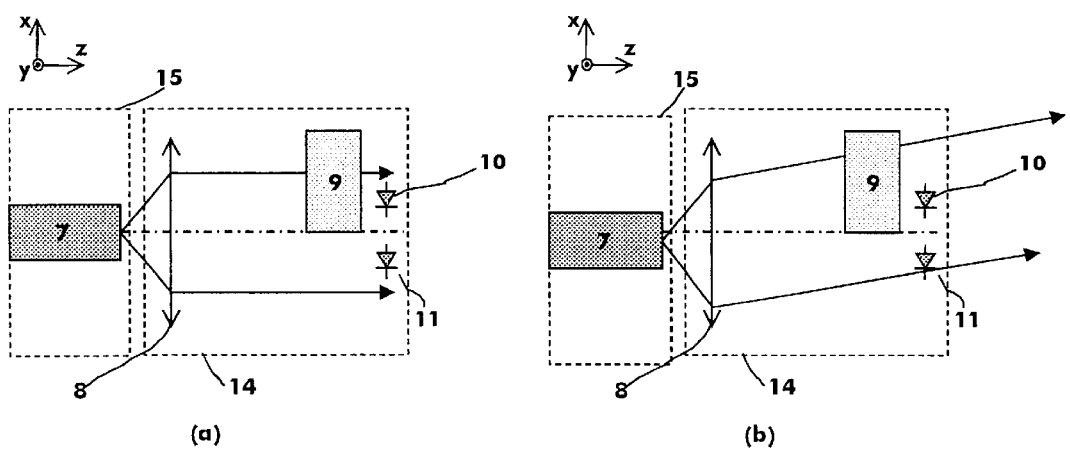

A second embodiment of the invention is given in FIG. 7.

Two building-blocks denoted 14 and 15 are used. Building block 14 contains the collimating lens 8, the dispersive element 9, the wavelength monitoring photodiode (10, the power monitoring photodiode 11. On the building block 15 only the laser diode 7 is mounted.

The FIG. 7b shows the variation made by moving the building block 14 respectively to the block 15.

The method used to adjust the wavelength monitor in the right position starts with two building blocks, at least one of them movably supported on a base plate. The laser diode is connected to the driver circuit to run. The laser beam is analyzed by the photodiodes and the connected electronic circuit. The method for analyzing the electrical signal of the photodiodes is not the core of the invention. This analysis can made in a way described in prior art, e.g. the U.S. Pat. No. 4,583,228. This measurement shows that it is necessary to move the building blocks relative to one another. The building blocks are carefully moved up to a position where the photodiodes' signals show a perfect zero transit signal at the desired wavelength. Then the building blocks are fixed on the base plate or to each other. The fixation can be done by laser welding, for example using a YAG-laser or any other fixation method.

The building blocks described above can be made by any material used for optoelectronic components. It can be for example metallic materials (as Kovar, Invar . . . ), silicon, glass, ceramics . . .

The building blocks are mounted on a base plate of a material that can by used to fix the building block after adjustment. The base plate can use the same materials that the building blocks does (which allow to adapt the coefficient of thermal expansion). In many cases, it can be the ceramics of a Peltier cooler as well.

What is claimed is:

1. A wavelength stabilization monitor (1) comprising:
   a laser source (7),
   a collimating element (8) receiving light from said laser source and providing collimated light output;
   a wavelength filter (9) receiving light from said collimating element; and
   two photodiodes (10, 11), receiving light from said collimating element and said wavelength filter, respectively, and for outputting corresponding electrical signals;
   wherein the collimating element (8) is movable in relation to the laser source.

2. The wavelength stabilization monitor (1) according to claim 1, where the laser source (7), the two photodiodes (10, 11) and the wavelength filter (9) are fixed on a first building block (12) and said collimating element (8) on a second building block (13) movable relative to said first building block.

3. The wavelength stabilization monitor (1) according to claim 1, where the laser source (7) is fixed on a first building block (15) and the two photodiodes (10, 11), the wavelength filter (9) and the the collimating element (8) are fixed on a second building block (14).

4. The wavelength stabilization monitor (1) according to claim 1, where said laser source and collimating element are supported on respective building blocks (12, 13, 14, 15) which are moved and then fixed relative to each other.

5. A method for providing laser light with a stabilized wavelength output, said method comprising the steps of:

provide divergent light from a laser source;

receiving said divergent light in a collimating element and providing a collimated output;

receiving at least a portion of said collimated output in a wavelength filter and providing a filtered output;

receiving at least a portion of said collimated output in a first photodiode while receiving at least a portion of said filtered output at a second photodiode;

adjusting said wavelength of said laser source output in accordance with outputs from said photodiodes; and moving said collimating element in relation to said laser source to vary at least one of said outputs of said photodiodes to obtain a desired wavelength output from said laser source and thereafter fixing said collimating element relative to said laser source.

6. The method according to claim 5 where the laser source and collimating element are mounted on respective building blocks which are moved relative to one another to adjust said wavelength.

7. A method according to claim 6 where the building blocks are moved along an x- or y-axis.

8. A method according to claim 6, where the building blocks are fixed in position relative to one another when the desired wavelength is obtained.

* * * * *